(12) United States Patent
Lawton et al.

(10) Patent No.: US 7,134,906 B2
(45) Date of Patent: Nov. 14, 2006

(54) OPTICAL NETWORKING SYSTEMS

(75) Inventors: Michael Case Lawton, Colchester (GB); David Meadowcroft, Stowmarket (GB)

(73) Assignee: Avago Technologies Fiber (IP) Singapore Pte. Ltd., Singapore (SG)

( * ) Notice: Subject to any disclaimer, the term of this patent is extended or adjusted under 35 U.S.C. 154(b) by 0 days.

(21) Appl. No.: 11/255,503

(22) Filed: Oct. 21, 2005

(65) Prior Publication Data

US 2006/0089042 A1 Apr. 27, 2006

(30) Foreign Application Priority Data

Oct. 21, 2004 (GB) ................. 0423340.9

(51) Int. Cl.
*H01R 13/00* (2006.01)
(52) U.S. Cl. ..................................... 439/485
(58) Field of Classification Search .............. 439/485, 439/949, 76.2; 361/697, 699, 704, 707, 709–710, 361/703, 683
See application file for complete search history.

(56) References Cited

U.S. PATENT DOCUMENTS

| 5,162,974 A | 11/1992 | Currie | 361/385 |
| 5,694,297 A * | 12/1997 | Smith et al. | 361/785 |
| 5,940,269 A | 8/1999 | Ko et al. | 361/697 |
| 5,980,306 A | 11/1999 | Tanaka et al. | 439/485 |
| 6,061,238 A | 5/2000 | Osakada et al. | 361/703 |
| 2002/0159235 A1 | 10/2002 | Miller et al. | 361/704 |
| 2004/0005808 A1 * | 1/2004 | Walkup et al. | 439/485 |
| 2004/0005810 A1 * | 1/2004 | Chang et al. | 439/485 |
| 2004/0038583 A1 * | 2/2004 | Peterson et al. | 439/485 |

FOREIGN PATENT DOCUMENTS

| JP | 52075185 A | 6/1977 |
| JP | 5015036 A | 1/1993 |
| JP | 8339864 A | 12/1996 |
| JP | 10302887 A | 11/1998 |

* cited by examiner

*Primary Examiner*—J. F. Duverne

(57) ABSTRACT

An optical networking system has connector blocks, each having a series of sockets. Each socket receives an optical transceiver and provides a full EMI shield. An active cooling system has heat pipes for drawing heat from the devices, through the sockets and to a heat exchanger.

7 Claims, 4 Drawing Sheets

OPTICAL NETWORKING SYSTEMS

The invention relates to optical networking equipment.

At present, such equipment typically comprises racks each having a board with a line of transceiver device sockets along one edge, facing outwards. Each socket comprises an electrical signal and power terminal, and an EMI housing having a front opening for insertion of the device. There is typically an array of apertures in the EMI housing for heat convection from the device inside in use.

In recent years there has been good progress in miniaturisation of the electronic and laser components of the devices. This has led to development of smaller devices, giving the ability for increasing numbers of devices in a rack. This, however, has led to increasing heat generation within the volume of space of a rack. If, say, 24 connectors are now fitted in a rack instead of 8 the heat generated rises from 8×4W to 24×4W for the same volume.

Manufacturers of transceiver devices have heretofore relied on the users to install adequate cooling equipment, possibly a fan for each group of three racks. However, despite best efforts at providing such cooling equipment it is often the case that there is a non-uniform temperature profile along a rack, and the hotter devices are prone to development of heat-induced faults.

Another problem with the existing networking equipment is that the housings are inadequate for full EMI shielding because they need to be open enough for heat convection. This problem is exacerbated as the electronic and laser components operate at ever-greater frequencies, in excess of 10 Gb/sec.

The invention is therefore directed towards providing optical device networking equipment providing improved cooling of transceiver devices for uniform connector temperatures, and also improved EMI shielding.

STATEMENTS OF INVENTION

According to the invention, there is provided a transceiver networking system comprising:
- sockets for receiving transceiver devices, the sockets being in a connector block providing an EMI shield, and
- the connector block comprises an active cooling system for heat removal from the devices.

In one embodiment, the system comprises a plurality of connector blocks whereby the sockets form a grid in a front face of a housing.

In another embodiment, the cooling system comprises heat pipes.

In a further embodiment, the heat pipes are at the rear of the sockets.

In one embodiment, the heat pipes run along the length of the connector blocks.

In another embodiment, the cooling system comprises a heat sink extending along the length of the connector block.

In a further embodiment, the heat sink comprises fins extending rearwardly from the connector block.

In one embodiment, the heat pipes are located between the sockets and the heat sink.

In another embodiment, the system comprises a line card, which extends underneath the heat sink and is bent upwardly to connect to the sockets or transceiver devices in the sockets.

In a further embodiment, the line card comprises a series of fingers, each bent upwardly to connect to a socket or transceiver device.

In one embodiment, the line card is connected to the sockets or transceiver devices by a connector, which is of a high thermal conductivity material for thermal conduction through the socket, the connector, the card, and to the cooling system.

In another embodiment, the card is of thin material.

DETAILED DESCRIPTION OF THE INVENTION

The invention will be more clearly understood from the following description of some embodiments thereof, given by way of example only with reference to the accompanying drawings in which.

Figure 1:
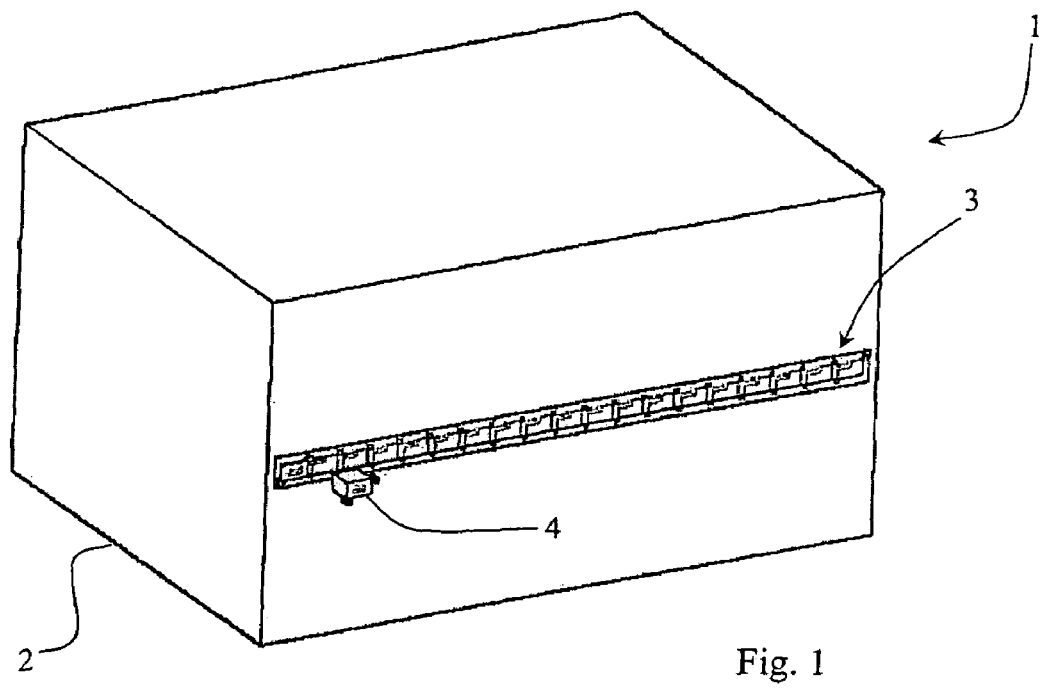
FIG. 1 is a front perspective view of an optical networking system of the invention, in which only one connector block is shown.
Figure 2:
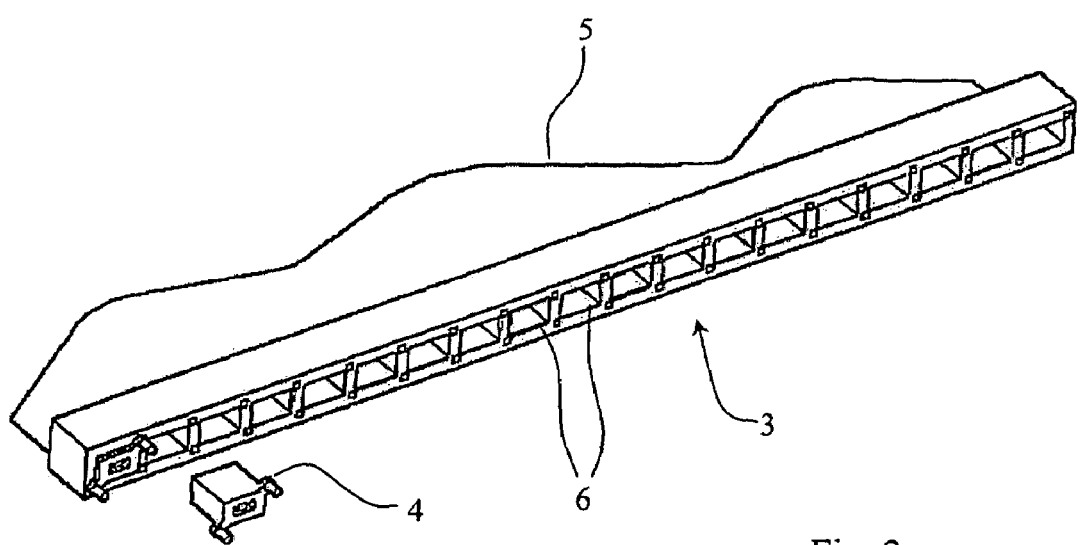
FIGS. 2 and 3 are front and rear perspective views of a connector block when removed from the housing.
Figure 3:
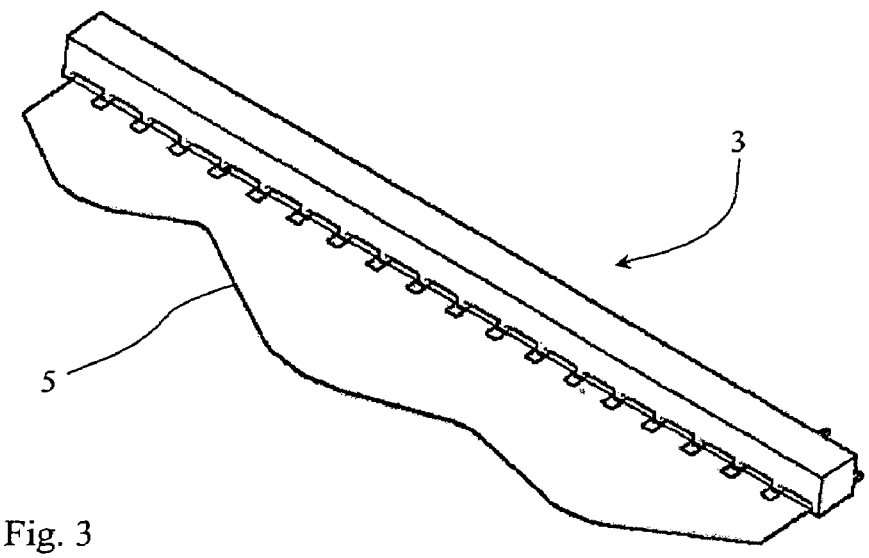

Referring to FIGS. 1 to 4 a networking system 1 comprises a housing 2 and multiple connector blocks 3 for receiving transceiver devices 4. There are multiple connector blocks 3, one above the other, although only one of the blocks 3 is shown in FIGS. 1 to 4, for clarity. Each connector block 3 is at the edge of a line card 5 and has sockets 6 for receiving transceiver devices 4.

Figure 4:
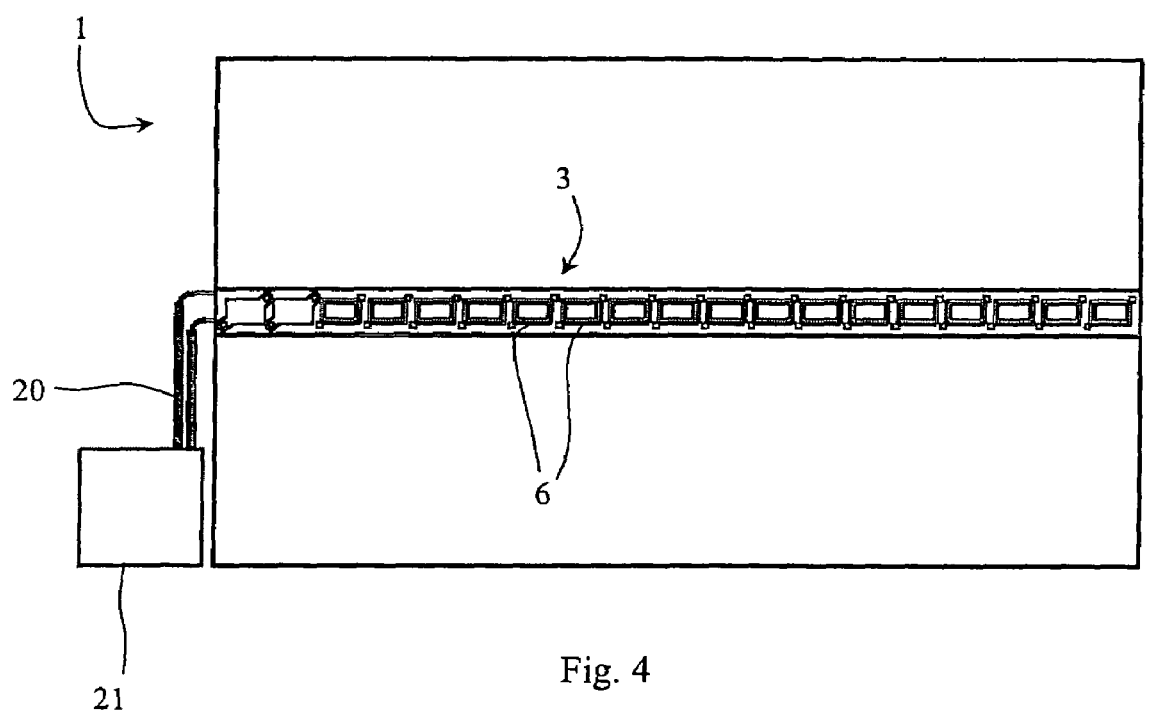
FIG. 4 is a front view showing heat pipes connected to an external heat exchanger.
Figure 5:
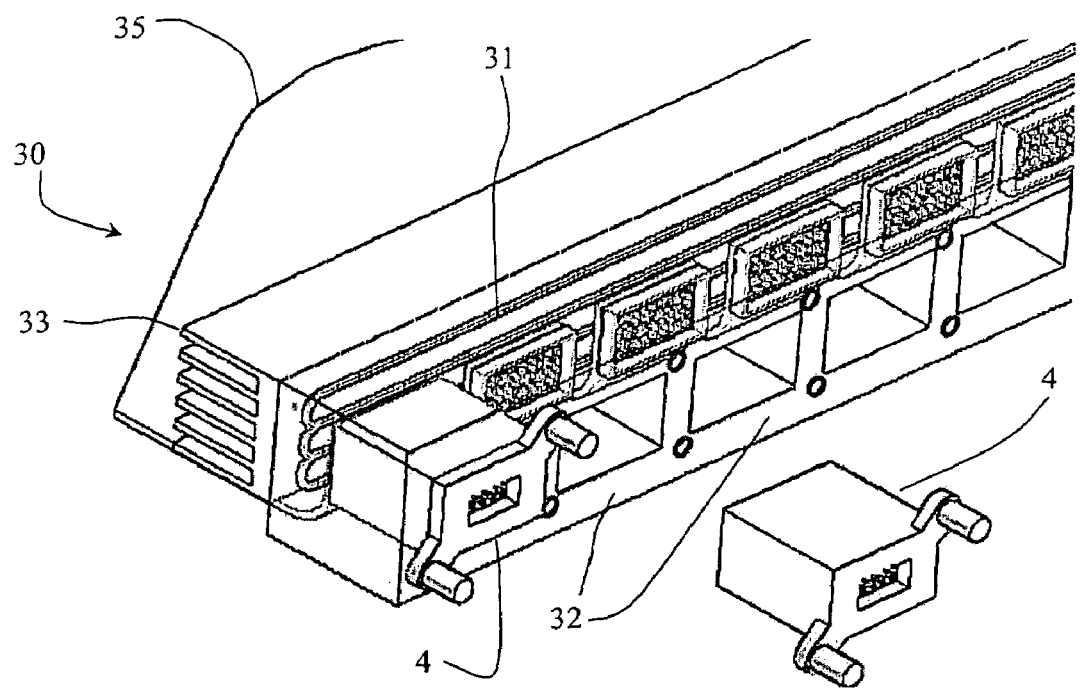
FIG. 5 is a front perspective view of an alternative connector block, in which an outer housing is omitted for visibility of internal parts.
Figure 6:
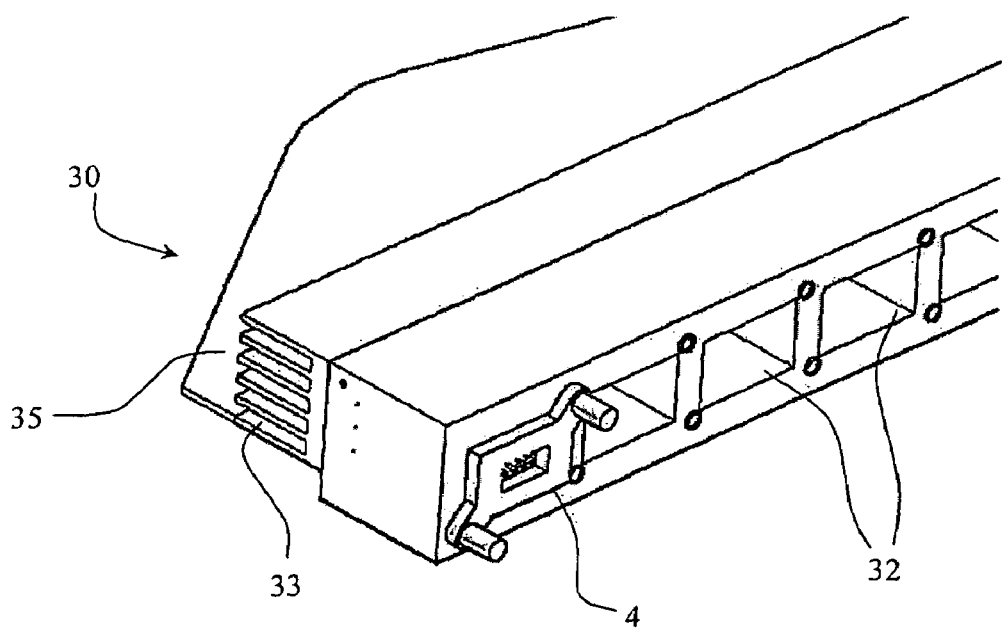
FIGS. 6 and 7 are front and rear perspective views.
Figure 7:
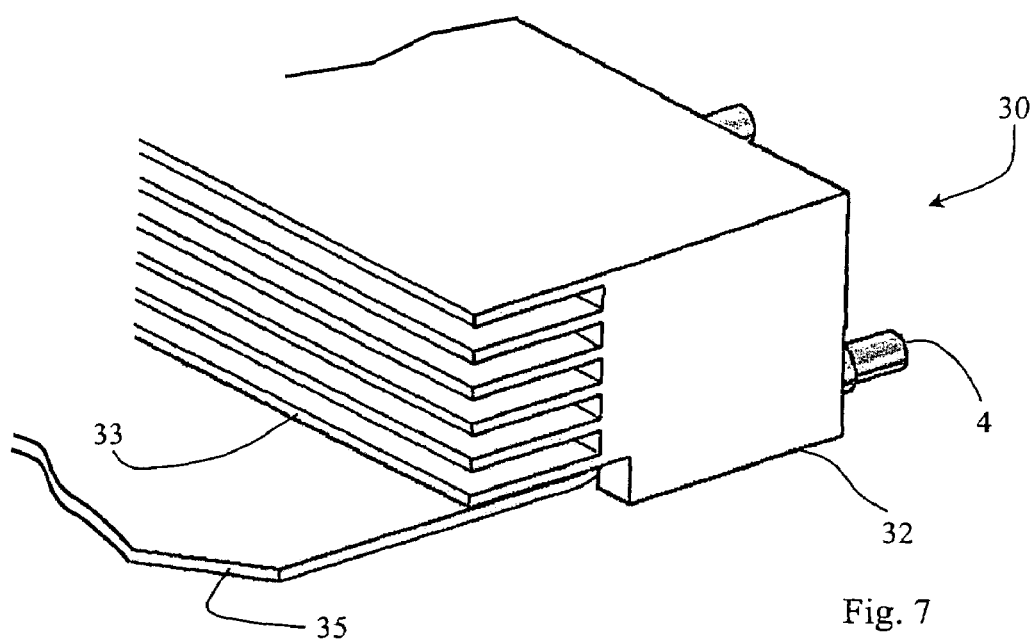

Each connector block 3 has an active cooling system for removing heat by conduction through a rear wall of each socket. Referring to FIG. 4, the connector block 3 comprises heat pipes 20 for heat transfer to an external heat exchanger 21. Thus, there is active and effective heat transfer from each device 4 inserted in a socket 6 in a uniform manner. This avoids hot-spots and in general improves the reliability of the optical devices. In effect, the main body of each connector block 3 forms a heat sink for initial heat conduction from the devices 4, the remaining heat transfer being through the heat pipes 20 to the external heat exchanger 21.

Also, each socket 6 forms a complete enclosure, shielding the environment from EMI generated by the device 4 inserted in it. There are no openings for heat convection because of the heat conduction paths described above.

Referring to FIGS. 5, 6, 7, and 8 a connector block 30 comprises heat pipes 31 which transfer heat efficiently from sockets 32 to a heat sink 33 extending along the length of the connector block 30. This is a more compact arrangement, not requiring an external heat exchanger.

Figure 8:
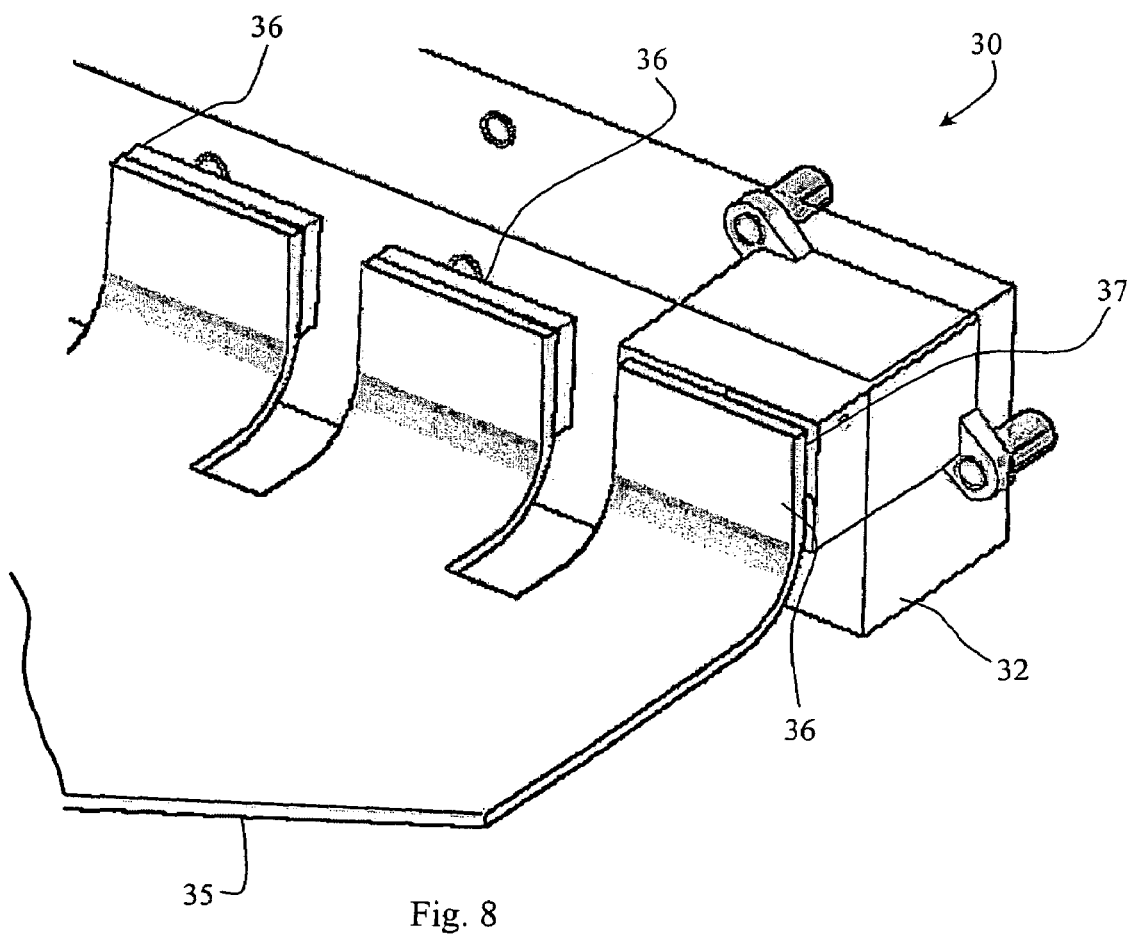
FIG. 8 is a rear perspective view showing how a board is connected.

Referring specifically to FIG. 8, the manner in which a line card board 35 is connected to the block 30 and the devices 4 is shown. The board 35 includes a finger 36 connected at a connector 37 to each socket 32. Each finger 36 is bent through 90° so that it fits underneath the heat sink and slots into a gap between the sockets and the heat sink 33. The fingers 36 are of flexible PCB material, and they each have a meg array style connector 37. Each finger 36 and the connector 37 are together a further EMI seal for the back of the socket 32.

In use, heat is conducted from the transceiver 4, through the meg array connector 37, the PCB 36 (which is thin), and into the heat pipes. There is also heat conduction through the rear wall of the connector block 3 and by connection to the heat pipes.

The invention is not limited to the embodiments described but may be varied in construction and detail.

The invention claimed is:

1. A transceiver networking system comprising:
   sockets for receiving transceiver devices, the sockets being in a connector block providing an EMI shield, and
   the connector block having an active cooling system for heat removal from the devices, the active cooling system including:
      a heat sink with fins extending rearwardly from the connector block, the heat sink extending along a length of the connector block; and
      heat pipes running along the length of the connector block and interposed between the connector block and the heat sink.

2. A transceiver networking system as claimed in claim 1, wherein the system comprises a plurality of connector blocks whereby the sockets form a grid in a front face of a housing.

3. A transceiver networking system as claimed in claim 1, wherein the heat pipes are at the rear of the sockets.

4. A transceiver networking system comprising:
   sockets for receiving transceiver devices, the sockets being in a connector block providing an EMI shield, and
   wherein the connector block includes an active cooling system for heat removal from the devices, the active cooling system including:
      a plurality of heat pipes; and
      a heat sink with fins extending rearwardly from the connector block, the heat sink extending along the length of the connector block,
   the transceiver networking system further including a line card, which extends underneath the heat sink and is bent upwardly to connect to the sockets or transceiver devices in the sockets.

5. A transceiver networking system as claimed in claim 4, wherein the line card comprises a series of fingers, each bent upwardly to connect to a socket or transceiver device.

6. A transceiver networking system as claimed in claim 4, wherein the line card is connected to the sockets or transceiver devices by a connector which is of a high thermal conductivity material for thermal conduction through the socket, the connector, the card and to the cooling system.

7. A transceiver networking system as claimed in claim 6, wherein the card is of thin material.

* * * * *